United States Patent
Nakata et al.

(10) Patent No.: US 8,993,413 B2
(45) Date of Patent: Mar. 31, 2015

(54) METHOD OF MANUFACTURING SEMICONDUCTOR DEVICE

(71) Applicants: Kazunari Nakata, Tokyo (JP); Yoshiaki Terasaki, Tokyo (JP)

(72) Inventors: Kazunari Nakata, Tokyo (JP); Yoshiaki Terasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/708,358

(22) Filed: Dec. 7, 2012

(65) Prior Publication Data

US 2013/0203241 A1    Aug. 8, 2013

(30) Foreign Application Priority Data

Feb. 2, 2012    (JP) .................... 2012-020829

(51) Int. Cl.
     *H01L 21/00*      (2006.01)
     *H01L 21/02*      (2006.01)
     *H01L 21/78*      (2006.01)
     *H01L 21/683*      (2006.01)

(52) U.S. Cl.
     CPC .......... *H01L 21/02005* (2013.01); *H01L 21/78* (2013.01); *H01L 21/6836* (2013.01); *H01L 2221/68331* (2013.01)
     USPC ........... 438/464; 438/459; 438/460; 438/462; 257/E21.599

(58) Field of Classification Search
     CPC ............... H01L 21/78; H01L 21/6836; H01L 2221/68331
     USPC .......................... 438/458, 459, 460, 462, 464
     See application file for complete search history.

(56) References Cited

U.S. PATENT DOCUMENTS

| | | | | |
|---|---|---|---|---|
| 3,521,128 | A * | 7/1970 | Oates | 257/676 |
| 6,010,782 | A * | 1/2000 | Uemura et al. | 428/343 |
| 6,337,258 | B1 * | 1/2002 | Nakayoshi et al. | 438/464 |
| 7,968,428 | B2 * | 6/2011 | Abe | 438/458 |
| 2002/0046450 | A1 * | 4/2002 | Odashima et al. | 29/25.01 |
| 2004/0089515 | A1 | 5/2004 | Yoo | |
| 2005/0062301 | A1 | 3/2005 | Yoo | |
| 2005/0095100 | A1 | 5/2005 | Yoo | |
| 2006/0005911 | A1 * | 1/2006 | Kubo et al. | 156/84 |
| 2007/0007247 | A1 | 1/2007 | Sekiya | |
| 2007/0045799 | A1 * | 3/2007 | Sekiya | 257/678 |

FOREIGN PATENT DOCUMENTS

| | | |
|---|---|---|
| JP | 2001-024010 A | 1/2001 |
| JP | 2007-019379 A | 1/2007 |
| JP | 2009-289809 A | 12/2009 |
| JP | 2010-093005 A | 4/2010 |
| JP | 2011-009341 A | 1/2011 |
| KR | 10-2004-0041789 A | 5/2004 |

OTHER PUBLICATIONS

Korean Office Action mailed Nov. 26, 2013, Application No. 10-2013-0008382.

* cited by examiner

*Primary Examiner* — Reema Patel
*Assistant Examiner* — Syed Gheyas
(74) *Attorney, Agent, or Firm* — Studebaker & Brackett PC (57) ABSTRACT

A method of manufacturing a semiconductor device includes the steps of preparing a semiconductor wafer having a thick portion in an outer circumferential end portion and a thin portion in a central portion, attaching a support material to one surface of the semiconductor wafer, dividing the semiconductor wafer into the thick portion and the thin portion, and cutting the thin portion, after the division, while supporting the thin portion by the support material.

6 Claims, 6 Drawing Sheets

METHOD OF MANUFACTURING SEMICONDUCTOR DEVICE

BACKGROUND OF THE INVENTION

1. Field of the Invention

The present invention relates to methods of manufacturing semiconductor devices, and more particularly to a method of manufacturing a semiconductor device using a wafer having a thin portion of small thickness.

2. Description of the Background Art

In recent years, there has been a demand for using a thinner wafer in a method of manufacturing a semiconductor device. In order to achieve a higher density package by three-dimensional mounting and the like for LSIs, the thickness of a wafer upon completion of the process has been reduced to as small as about 10 μm.

For power devices such as IGBTs (Insulated Gate Bipolar Transistors) and MOSFETs (Metal-Oxide-Semiconductor Field-Effect Transistors), a semiconductor substrate is subjected to a thinning process to improve current-carrying characteristics typified by ON characteristics, for applications as an inverter circuit of an industrial motor, a motor for a vehicle and the like, and as a power conversion semiconductor switch of various types of power supply devices. To improve cost performance and characteristics, a semiconductor device has recently been manufactured by a process which utilizes an ultra-thin wafer as small as about 50 μm, using a wafer material made with the FZ (Floating Zone) method.

In general, a wafer is thinned by wet etching or dry etching for removing processing distortion created by back grinding, chemical mechanical polishing and mechanical polishing. Then, a diffusion layer is formed by ion implantation and heat treatment, and an electrode is formed by sputtering or the like, on a back surface. With such method, the frequency of occurrence of cracking of a wafer when processing the back surface of the wafer is increasing.

Thus, in order to thin a wafer, a method of processing a wafer by thinning only a central portion of the wafer while maintaining a thick outer circumferential portion of the wafer has recently been proposed (Japanese Patent Laying-Open No. 2007-019379). By using such wafer with a rib having the thick portion and the thin portion, the warpage of the wafer is significantly relieved to facilitate wafer transfer in a processing device, and the strength of the wafer is significantly improved during handling of the wafer, thereby reducing the cracking and chipping of the wafer.

Such wafer with a rib has the effect of relieving the warpage and improving the strength of the wafer during a wafer process. On the other hand, since the portions of different thicknesses are present in the same wafer plane, if a wafer is diced in accordance with the thinned device region, the depth of dicing of the rib portion will be insufficient, resulting in lowered quality of the dicing process. Moreover, the degree of attachment of dicing tape will be insufficient in the vicinity of the rib portion due to the unevenness caused by the rib portion, resulting in lowered accuracy of the dicing process.

For example, Japanese Patent Laying-Open No. 2010-093005 proposes a method of attaching a wafer with a rib to dicing tape, then performing dicing from the device surface side in accordance with a thinned device region, expanding the dicing tape, and then picking up only chips each having a semiconductor device fabricated therein.

To address the problem as described above, for example, Japanese Patent Laying-Open No. 2011-009341 proposes a method of filling a recess of a wafer with a rib with a resist agent, removing the rib portion by dicing, then removing the resist agent by wet etching or the like, and attaching the wafer to dicing tape.

SUMMARY OF THE INVENTION

These two methods of dicing a wafer having a thick portion and a thin portion, however, include the following yield-reducing factors, respectively.

If the entire surface of the wafer having a thick portion and a thin portion is diced under the same condition as described in Japanese Patent Laying-Open No. 2010-093005, the cutting of the thick portion will be incomplete when a condition suitable for the thin portion is employed. This incompletely cut thick portion will be separated during the expansion of the dicing tape, resulting in chipping of the wafer, and the adherence of foreign matters that cause chipping onto diced semiconductor devices. It is difficult to suppress the chipping even if the dicing tape is expanded with the wafer surface facing downward. When a condition suitable for the thick portion is employed, on the other hand, the dicing tape will be simultaneously cut in the thin portion, resulting in lowered quality of the dicing process, and the difficulty in subsequently handling the diced semiconductor devices.

In the method of performing dicing after removing a thick portion as described in Japanese Patent Laying-Open No. 2011-009341, after the thick portion is removed and only the thin portion is held by surface protective tape, the resist on a back surface is removed and the dicing tape is attached, to perform dicing. Thus, the risk of occurrence of cracking and chipping of the wafer increases in the steps after the thick portion has been removed.

The present invention was made to solve the problems as described above. A main object of the present invention is to provide a method of manufacturing a semiconductor device, which is capable of improving the quality of a semiconductor device after dicing of a semiconductor wafer having a thick portion and a thin portion.

A method of manufacturing a semiconductor device according to the present invention includes the steps of preparing a semiconductor wafer having a thick portion in an outer circumferential end portion and a thin portion in a central portion, attaching a support material to one surface of the semiconductor wafer, dividing the semiconductor wafer into the thick portion and the thin portion, and cutting the thin portion, after the division, while supporting the thin portion by the support material.

In the method of manufacturing a semiconductor device of the present invention, the semiconductor wafer is divided into the thick portion and the thin portion before the thin portion is diced, thereby suppressing a reduction in quality of the dicing. Furthermore, the division into the thick portion and the thin portion and the dicing of the thin portion are performed with the support material being attached to the one surface of the semiconductor wafer, thereby suppressing the cracking and chipping of the thin portion as well. Therefore, the quality of the semiconductor wafer after the dicing can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings. In the following drawings, the same or corresponding parts are designated with the same reference signs, and descriptions thereof will not be repeated.

First Embodiment

Figure 1:
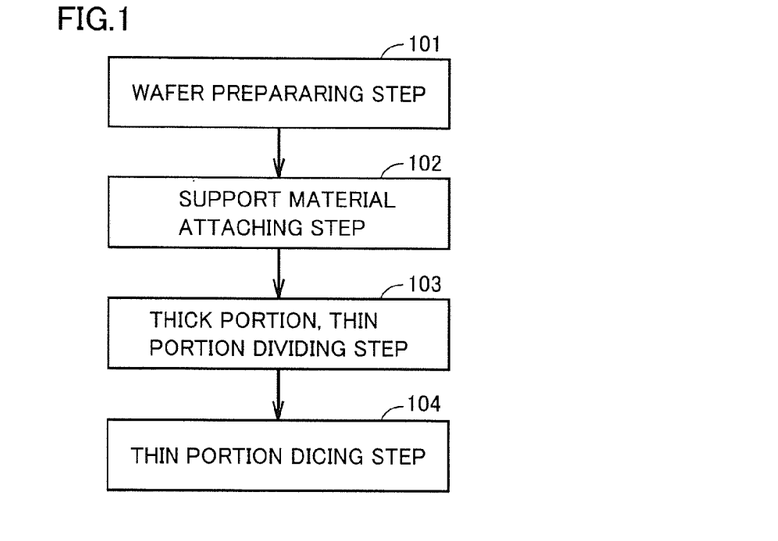
FIG. 1 illustrates a flow of steps of a method of manufacturing a semiconductor device according to a first embodiment of the present invention.

Referring to FIG. 1, first, a general flow of a method of manufacturing a semiconductor device in a first embodiment is described. First, in step 101, a semiconductor wafer having a thick portion, and a thin portion with semiconductor elements and wires formed therein, is prepared. Next, in step 102, a support material is attached to a back surface opposite to a main surface of the semiconductor wafer. Then, in step 103, the semiconductor wafer is divided into the thick portion and the thin portion while being supported by the support material. After the division, in step 104, the thin portion with semiconductor elements and wires formed therein is diced into individual semiconductor devices while being supported by the support material.

In this manner, a support material 2 that is attached to a semiconductor wafer 1 in step 102 can be used through step 104. This eliminates the operation of reattaching support material 2 for dicing to a thin portion 1b after the division, thereby suppressing cracking and chipping of thin portion 1b. Moreover, the quality of the dicing can be improved.

The steps shown in FIG. 1 will be described with reference to the drawings. First, referring to FIGS. 2 and 3, the step of preparing the semiconductor wafer having the thick portion in an outer circumferential portion and the thin portion in a central portion is described (step 101). For example, after the semiconductor elements, wires and the like are formed in the central portion of the main surface of semiconductor wafer 1, a protective tape 2a is attached to the main surface of semiconductor wafer 1, and a central portion of the back surface opposite to the main surface of semiconductor wafer 1 is ground to a prescribed thickness. As a result, the portion which has not been ground becomes the thick portion and the portion which has been ground becomes the thin portion, to form the semiconductor wafer having the thick portion and the thin portion.

Figure 2:
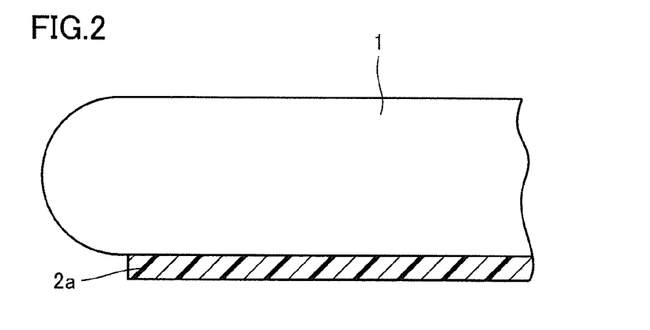
FIG. 2 is a partial cross-sectional view showing an example of a method of forming a thick portion and a thin portion in a semiconductor wafer.
Figure 3:
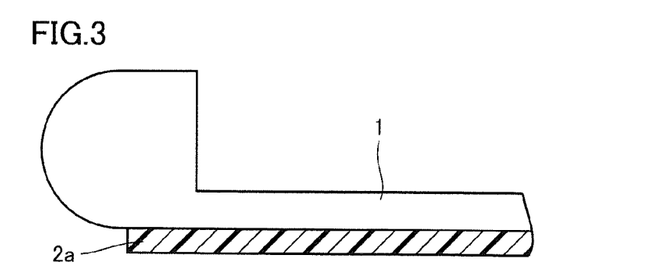
FIG. 3 is a partial cross-sectional view showing the example of the method of forming a thick portion and a thin portion in a semiconductor wafer.

After forming the thick portion in the outer circumferential portion and the thin portion in the central portion of the semiconductor wafer, the back surface of semiconductor wafer 1 may further be wet etched as necessary, using a mixed acid containing hydrofluoric acid and nitric acid in order to remove processing distortion. The back surface is also subjected to an ion implantation process or a laser annealing process for forming an impurity diffusion layer, a cleaning process, and metal sputtering and a vapor deposition process for forming an electrode, as appropriate. In this manner, the semiconductor wafer having the thick portion in the outer circumferential portion and the thin portion with the semiconductor devices formed therein in the central portion is prepared.

Figure 4:
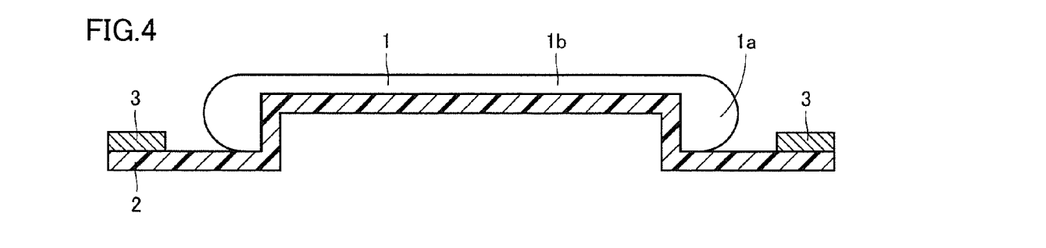
FIG. 4 is a cross-sectional view showing a state where a support material has been attached to the semiconductor wafer.

Next, referring to FIG. 4, support material 2 for supporting semiconductor wafer 1 having thick portion 1a and thin portion 1b is attached to the back surface of semiconductor wafer 1 (step 102).

Semiconductor wafer 1 having thick portion 1a and thin portion 1b with the semiconductor elements formed therein is mounted on a frame 3 by support material 2. Here, support material 2 is attached across thin portion 1b and thick portion 1a to the back surface of semiconductor wafer 1. By attaching support material 2 across a side surface and a bottom surface of thick portion 1a to the back surface, the occurrence of abnormality such as chipping can be suppressed during the subsequent division of semiconductor wafer 1 into thick portion 1a and thin portion 1b.

Support material 2 can be made of any material including an adhesive and elastic member. For example, heat-shrinkable adhesive tape can be employed.

Figure 5:
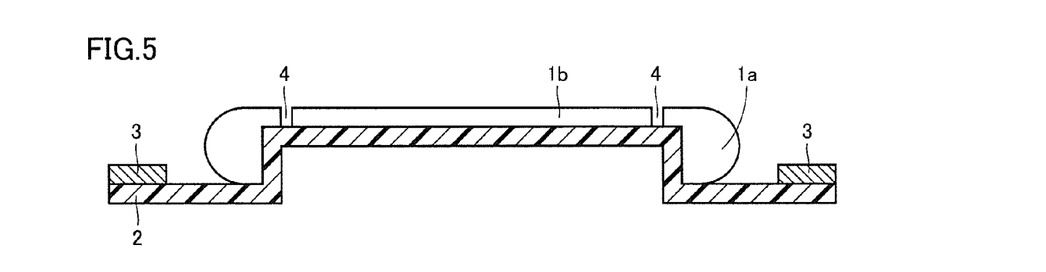
FIG. 5 is a cross-sectional view showing a state where the semiconductor wafer has been divided into the thick portion and the thin portion.

Next, referring to FIG. 5, semiconductor wafer 1 is divided into thick portion 1a and thin portion 1b along a division portion 4 in such a manner that support material 2 is not cut (step 103). The division can be implemented by blade dicing or laser dicing. The position of division portion 4 is determined such that a maximum area with the semiconductor elements formed therein is left on thin portion 1b, and that divided thin portion 1b does not include thick portion 1a. Thus, divided thick portion 1a may include thin portion 1b as shown in FIG. 5.

Figure 6:
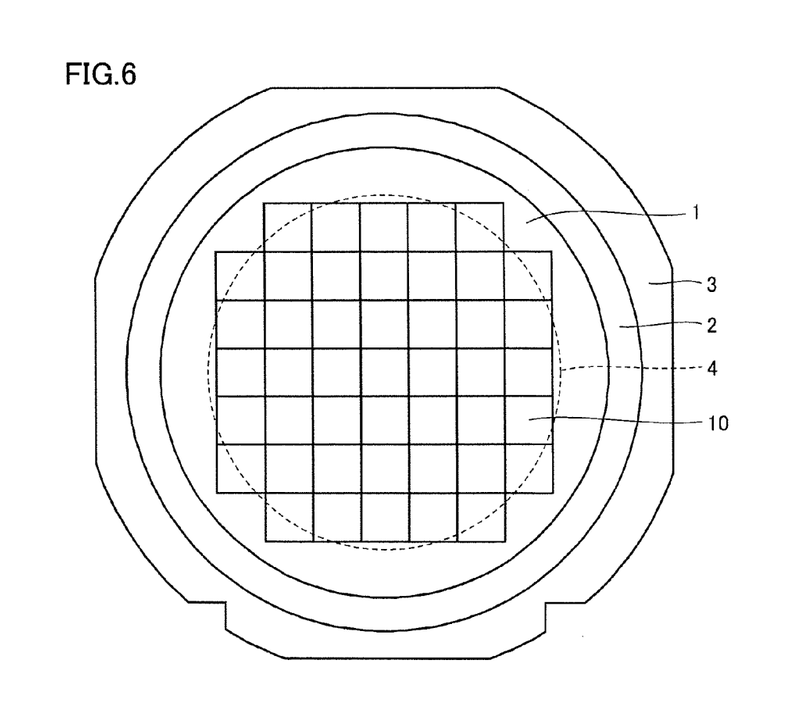
FIG. 6 is a plan view of the semiconductor wafer shown in FIG. 4.

FIG. 6 is a plan view of semiconductor wafer 1 before semiconductor wafer 1 is divided into the thick portion and the thin portion along division portion 4. Semiconductor wafer 1 with individual semiconductor devices 10 formed in the central portion is mounted on frame 3 by support material 2, and divided along division portion 4.

Figure 8:
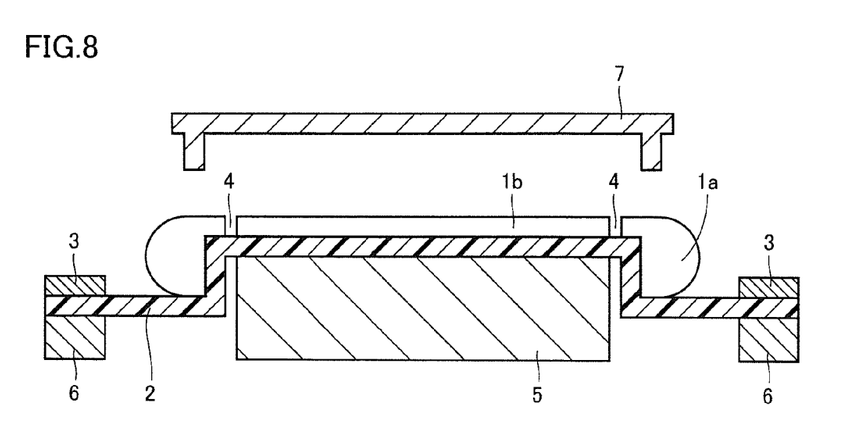
FIG. 8 is a cross-sectional view illustrating an example of a step of separating the thick portion.
Figure 9:
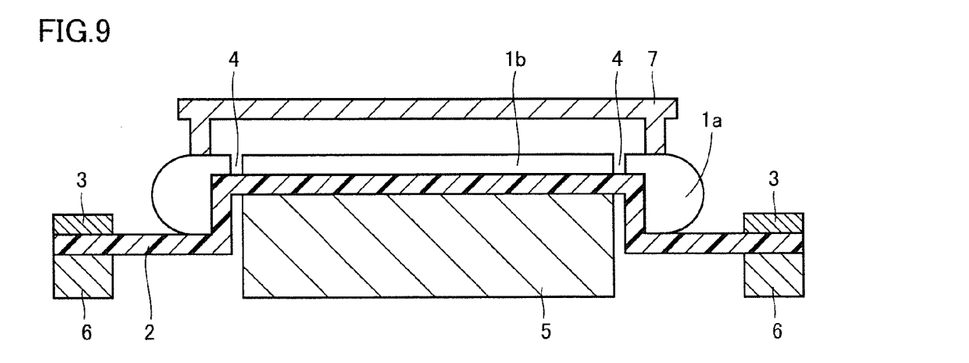
FIG. 9 is a cross-sectional view illustrating the example of the step of separating the thick portion.
Figure 10:
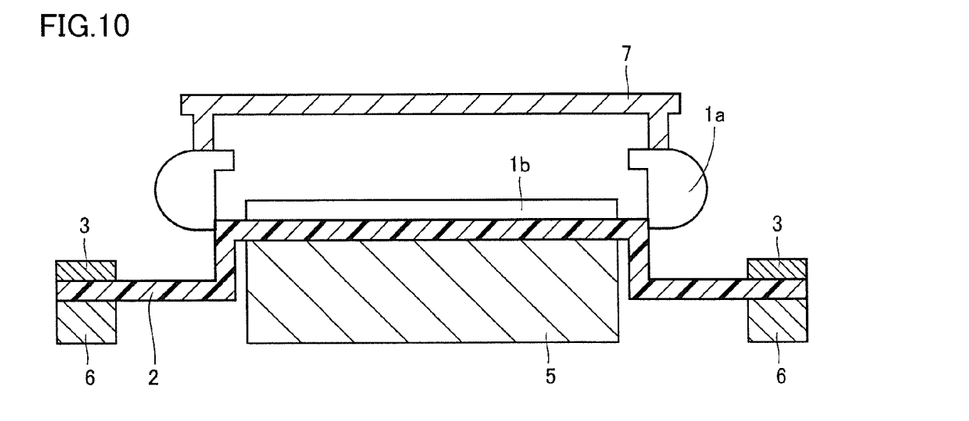
FIG. 10 is a cross-sectional view illustrating the example of the step of separating the thick portion.

After dividing semiconductor wafer 1 into the thick portion and the thin portion as described above, thick portion 1a may be separated from support material 2 as shown in FIGS. 8 to 10.

If thick portion 1a is separated from support material 2 before an expansion step after the dicing of thin portion 1b, the chipping of incompletely cut thick portion 1a during the expansion can be prevented. If the step of dicing thin portion 1b is implemented by blade dicing, it is preferable to separate thick portion 1a before the blade dicing. By doing so, cutting of thick portion 1a with a blade is avoided in the step of dicing thin portion 1b, thereby preventing the creation of grooves, cutting, burrs and the like in thick portion 1a. Accordingly, when separating thick portion 1a from support material 2 after the dicing, a reduction in holding force of a thick portion holding unit 7 is prevented, and the cuttings and the like can be prevented from flying onto the surface of thin portion 1b.

When separating thick portion 1a from support material 2, first, thin portion 1b is held by a thin portion holding unit 5 with support material 2 interposed therebetween, and frame 3 is held by a frame holding unit 6 with support material 2 interposed therebetween, as shown in FIG. 8, for example.

Next, referring to FIG. 9, thick portion holding unit 7 is brought into contact with thick portion 1a to hold thick portion 1a by vacuum adsorption or electrostatic adsorption. Then, referring to FIG. 10, thick portion holding unit 7 is moved relative to thin portion holding unit 5 and frame holding unit 6 in a thickness direction of semiconductor wafer 1, to separate thick portion 1a and support material 2 from each other.

Figure 7:
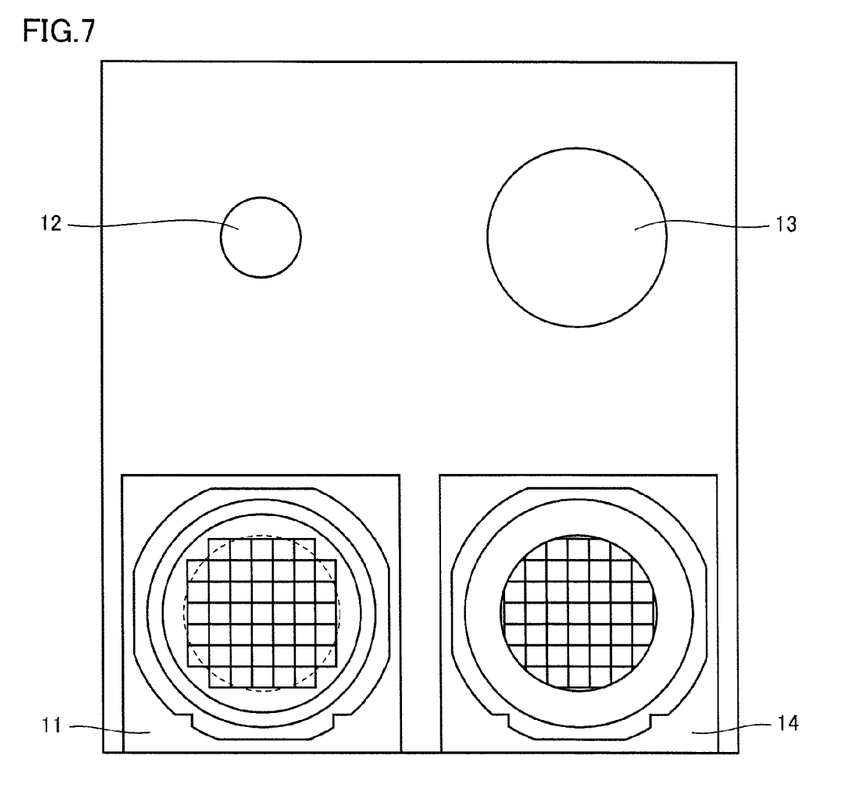
FIG. 7 shows an example of a thick portion separation device, which can be used in the method of manufacturing a semiconductor device according to the first embodiment of the present invention.

In the above step of separating thick portion 1a from support material 2, a thick portion separation device shown in FIG. 7 can be used, for example.

Referring to FIG. 7, an example of the structure of the thick portion separation device is described. First, as shown in FIG. 7, semiconductor wafer 1 that has been divided into thick portion 1a and thin portion 1b is placed in a semiconductor wafer introduction unit 11, while being mounted on frame 3 with support material 2 interposed therebetween. The semiconductor wafer is transferred to an alignment unit 12, where the position of the wafer is checked and adjusted, and is then transferred to a thick portion separation unit 13. Thick portion separation unit 13 performs the steps illustrated in FIGS. 8 to 10 as described above. The semiconductor wafer from which the thick portion has been separated in thick portion separation unit 13 is accommodated in a semiconductor wafer accommodation unit 14.

Since the distortion such as wrinkles may occur in support material 2, it is preferable to perform a step of stretching support material 2. The stretching of support material 2 as used herein refers to correcting the distortion such as wrinkles that has occurred in support material 2 to such a degree that the quality of dicing in the next step will not be lowered.

Figure 11:
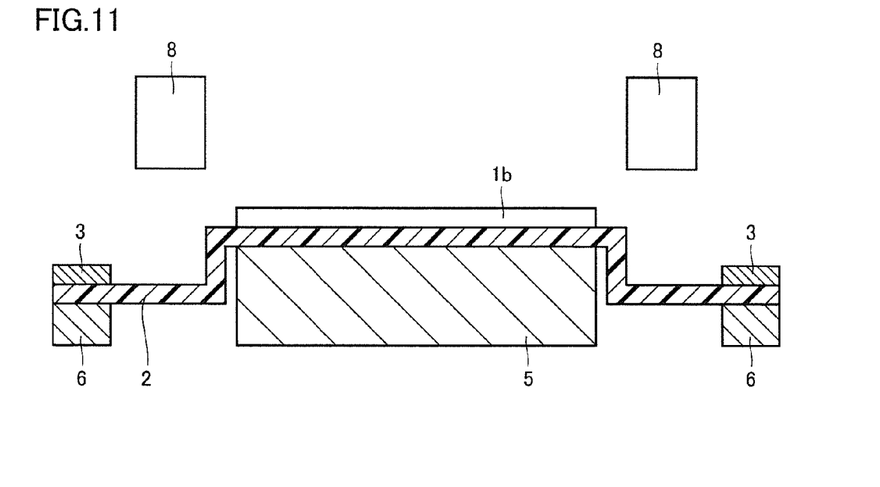
FIG. 11 is a cross-sectional view illustrating an example of a step of stretching the support material.
Figure 12:
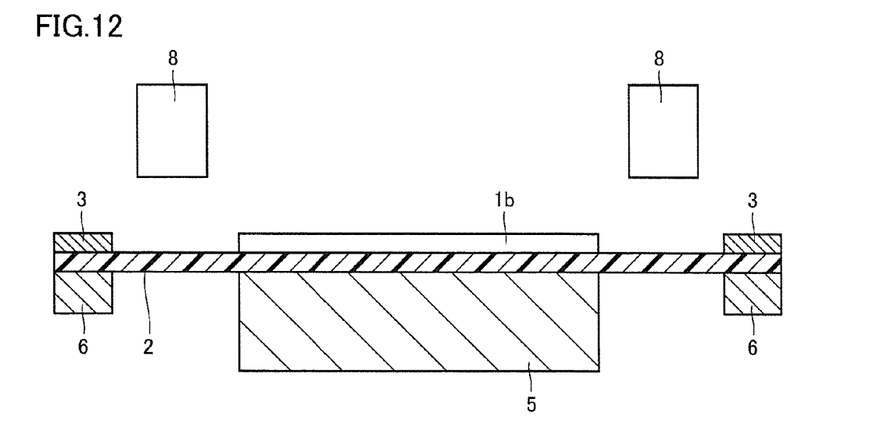
FIG. 12 is a cross-sectional view illustrating the example of the step of stretching the support material.

In this case, it is preferably to use heat-shrinkable support material 2. As shown in FIG. 11, a portion of support material 2 where the distortion such as wrinkles has occurred is heated by a warm air supply unit 8. Here, by heating support material 2 while moving frame holding unit 6 and thin portion holding unit 5 so that they will be placed in the same plane, the distortion such as wrinkles that has occurred in support material 2 is stretched, and only thin portion 1b after the division is mounted on frame 3 by support material 2, as shown in FIG. 12.

Accordingly, the blade can be prevented from coming into contact with support material 2 during blade dicing, thereby avoiding a reduction in cutting performance of the blade and a reduction in quality of the dicing process that are caused by the adherence of an adhesive component of support material 2 to a front end of the blade. Furthermore, a reduction in quality of the operation of removing the diced individual semiconductor devices can also be prevented.

Referring again to FIG. 1, thin portion 1b supported by support material 2 is diced (step 104). In this manner, support material 2 that is attached to semiconductor wafer 1 in step 102 can be used through step 104. This eliminates the operation of reattaching support material 2 for dicing to thin portion 1b after the division, thereby suppressing cracking and chipping of thin portion 1b. Moreover, since the thick portion does not need to be diced, the creation of an incompletely cut thick portion, or the cutting of support material 2 can be prevented. Thus, a reduction in quality of the dicing process can be suppressed. This can in turn suppress a reduction in quality of the semiconductor devices in the dicing step and a step of transferring the individual semiconductor devices.

Although the dicing is implemented by blade dicing in the method of manufacturing a semiconductor device according to the first embodiment, the dicing can be implemented by laser dicing.

Although a surface protective member for protecting the surface of the semiconductor wafer is not used in the method of manufacturing a semiconductor device according to the first embodiment, a surface protective member made of a water-soluble material, for example, that can be removed before the step of mounting the semiconductor devices, can be employed.

As described above, in the method of manufacturing a semiconductor device according to the first embodiment, the semiconductor wafer having the thick portion and the thin portion is divided into the thick portion and the thin portion before the thin portion is diced, thereby reducing the chipping of the thick portion and improving the quality of the dicing. Furthermore, the division into the thick portion and the thin portion and the dicing of the thin portion are performed using the same support material attached to the one surface of the semiconductor wafer, thereby suppressing the cracking and chipping of the thin portion.

Second Embodiment

Figure 13:
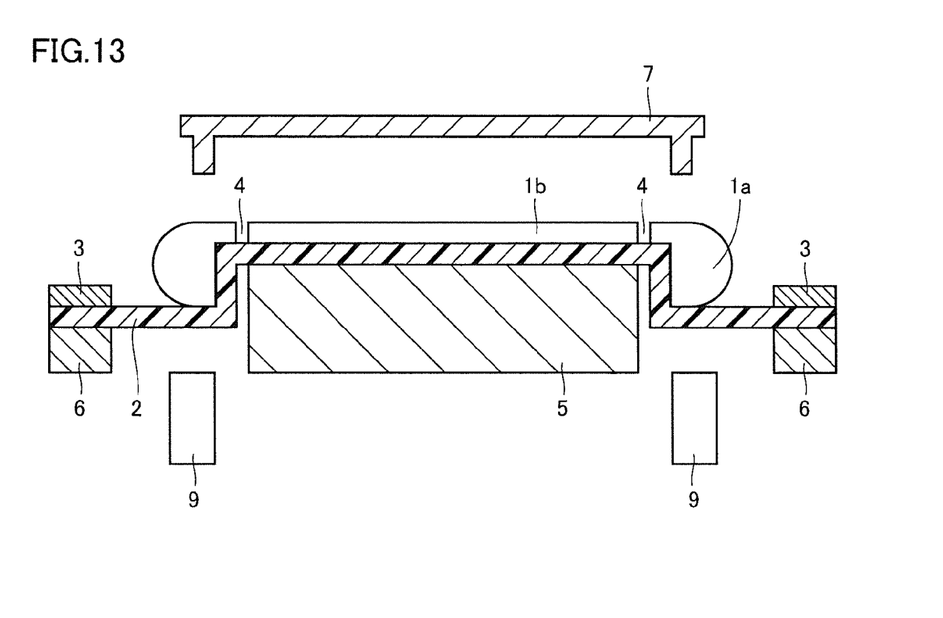
FIG. 13 is a cross-sectional view illustrating another example of the step of separating the thick portion.
Figure 14:
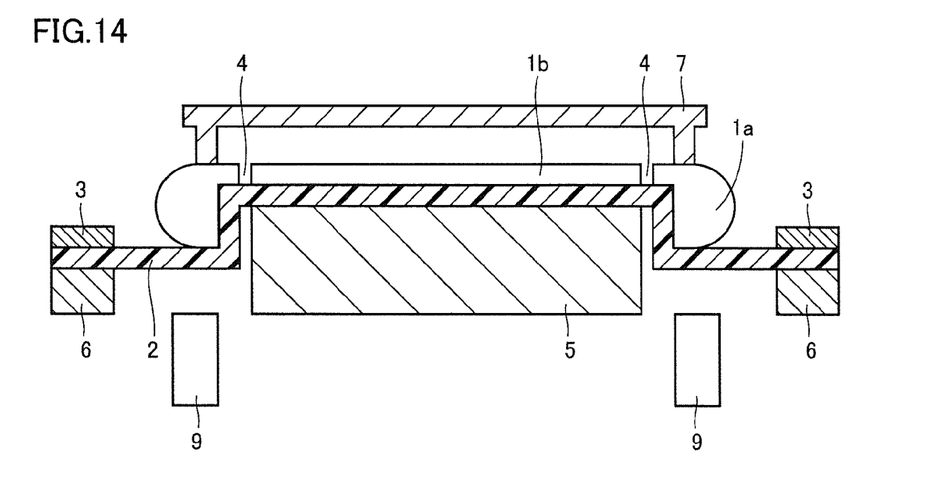
FIG. 14 is a cross-sectional view illustrating the another example of the step of separating the thick portion.

Referring to FIGS. 13 and 14, a second embodiment of the present invention is described. A method of manufacturing a semiconductor device according to the second embodiment is basically similar to that of the first embodiment, and is different in that a step of lowering the degree of adhesion of support material 2 in a portion in contact with thick portion 1a is provided, before the step of separating thick portion 1a from support material 2.

FIGS. 13 and 14 illustrate an example of the separation step using adhesive tape whose degree of adhesion is lowered when support material 2 is irradiated with ultraviolet rays. Ultraviolet rays are applied to support material 2 in the portion supporting thick portion 1a by an ultraviolet irradiation device 9 from the support material side, to lower the degree of adhesion. Consequently, the step of separating the thick portion in the first embodiment can be more readily performed.

The ultraviolet rays may be applied before or after thick portion 1a is held by thick portion holding unit 7. Alternatively, the degree of adhesion of support material 2 in the portion in contact with thick portion 1a may be lowered by employing support material 2 whose degree of adhesion is lowered by an external factor other than ultraviolet irradiation, and performing a step of applying the external factor before the separation step. Consequently, thick portion 1a can be readily separated, and the effect similar to that of the first embodiment can be expected.

Third Embodiment

A third embodiment of the present invention is described. A method of manufacturing a semiconductor device according to the third embodiment is basically similar to that of the first embodiment, and is different in that the step of dicing the thin portion is implemented by laser dicing.

Laser dicing process is capable of processing a wafer into chips of various shapes by turning laser on/off, and can form a thin portion without forming a thick portion. Thus, the thick portion does not need to be separated from the support material before dicing the thin portion in step 104 shown in FIG. 1, but may be separated from the support material with reference to FIGS. 8 to 10 before the expansion step. Namely, in the third embodiment where laser dicing is employed in step 104, the step of separating the thick portion from the support material may be performed before or after the dicing of the thin portion in step 104.

Again in this embodiment, a step of absorbing the distortion such as wrinkles may be performed after separating thick portion 1a from support material 2. Here, if thick portion 1a is separated from support material 2 after the laser dicing of thin portion 1b, and the step of absorbing the distortion such as wrinkles is implemented by heat shrinking, a member having heat shrinking property to such a degree that a distance between elements generated by the dicing (i.e., dicing line) is prevented from being non-uniform may be selected for support material 2. As a result, the dicing line can be prevented from being non-uniform, thereby suppressing a reduction in quality of the operation of removing the diced individual semiconductor devices.

Furthermore, a step of lowering the degree of adhesion of the support material may be provided as in the second embodiment. Consequently, the effect similar to that of the second embodiment can be expected.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device, comprising the steps of:

preparing a semiconductor wafer by removing material from a back surface located opposite to a main surface to form a thick portion in an outer circumferential end portion and a thin portion in a central portion;

attaching a support material to said back surface of said semiconductor wafer across said thin portion and said thick portion with the support material extending across an inner side surface and a bottom surface of the thick portion;

after attaching said support material, dividing said semiconductor wafer into said thick portion and into said thin portion;

separating said thick portion from said support material after the division;

stretching said support material by heat shrinking after separating said thick portion from said support material; and subsequently cutting said thin portion after separating said thick portion from said support material.

2. The method of manufacturing a semiconductor device according to claim 1, wherein said support material includes adhesive tape.

3. The method of manufacturing a semiconductor device according to claim 1, wherein said thick portion is separated while being held directly.

4. The method of manufacturing a semiconductor device according to claim 3, wherein said thick portion is held by vacuum adsorption.

5. The method of manufacturing a semiconductor device according to claim 3, wherein said thick portion is held by electrostatic adsorption.

6. The method of manufacturing a semiconductor device according to claim 2, further comprising the step lowering a degree of adhesion of said adhesive tape in a portion in contact with said thick portion, before separating said thick portion from said adhesive tape.

* * * * *